United States Patent
MacDonald et al.

(10) Patent No.: US 9,654,070 B2
(45) Date of Patent: May 16, 2017

(54) METHOD FOR STABILIZING THE GAIN OF A DISCRETE-STATE AUTOMATIC GAIN CONTROL CIRCUIT

(71) Applicant: Semtech Corporation, Camarillo, CA (US)

(72) Inventors: Ryan P. MacDonald, Kanata (CA); Matthew G. Hagman, Gatineau (CA)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 14/720,420

(22) Filed: May 22, 2015

(65) Prior Publication Data

US 2016/0344359 A1    Nov. 24, 2016

(51) Int. Cl.
  *H03G 3/20*    (2006.01)
  *H03F 3/45*    (2006.01)
  *H03G 1/00*    (2006.01)
  *H03G 3/00*    (2006.01)
  *H03G 3/30*    (2006.01)

(52) U.S. Cl.
  CPC ....... *H03F 3/45179* (2013.01); *H03G 1/0088* (2013.01); *H03G 3/001* (2013.01); *H03G 3/3084* (2013.01); *H03F 2200/135* (2013.01); *H03F 2200/171* (2013.01)

(58) Field of Classification Search
  CPC .................... H03F 3/08; H03G 3/20
  USPC .................... 330/86, 308; 250/214 AG
  See application file for complete search history.

(56) References Cited

U.S. PATENT DOCUMENTS

| | | | | |
|---|---|---|---|---|
| 5,854,994 | A * | 12/1998 | Canada | G01H 1/003 340/3.63 |
| 6,414,806 | B1 * | 7/2002 | Gowda | G11B 5/02 360/25 |
| 7,023,280 | B2 * | 4/2006 | Seetharaman | H03F 3/087 250/214 A |

* cited by examiner

*Primary Examiner* — Steven J Mottola
(74) *Attorney, Agent, or Firm* — Brian M. Kaufman; Robert D. Atkins; Patent Law Group: Atkins and Associates, P.C.

(57) ABSTRACT

An automatic gain controller comprises an amplifier including a variable gain. A resonant low-pass filter includes an input coupled to an output of the amplifier. The resonant low-pass filter is a second order low-pass filter. The second order low-pass filter includes a Sallen-Key topology. The Sallen-Key topology comprises a quality factor between 1.4 and 1.6. A threshold detection circuit includes an input coupled to an output of the second order low-pass filter to compare an output signal of the second order low-pass filter to a threshold and an output of the threshold detection circuit coupled to control the variable gain of the amplifier. A state machine is coupled between the output of the threshold detection circuit and the amplifier. The state machine is configured to transition based on a current state of the state machine. The resonant low-pass filter exhibits overshoot to trigger a hysteresis of the threshold detection circuit.

22 Claims, 6 Drawing Sheets

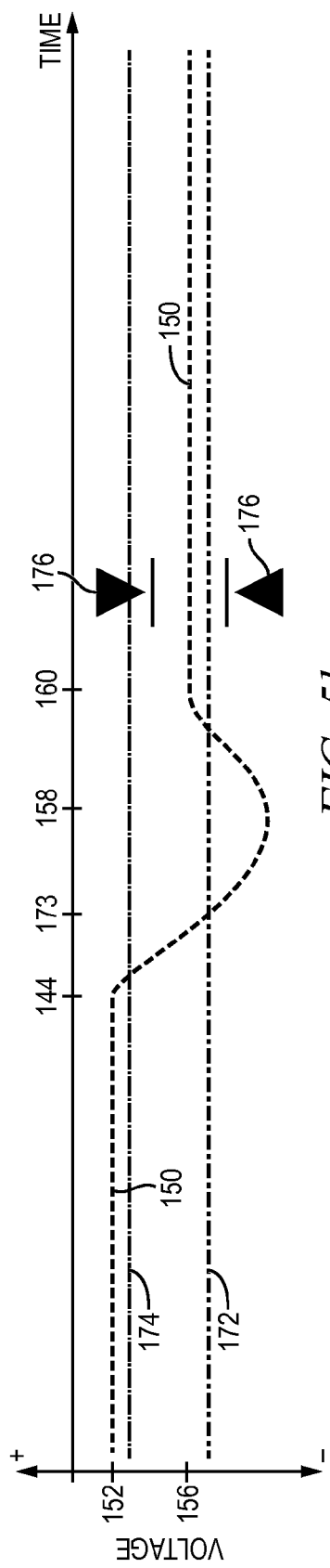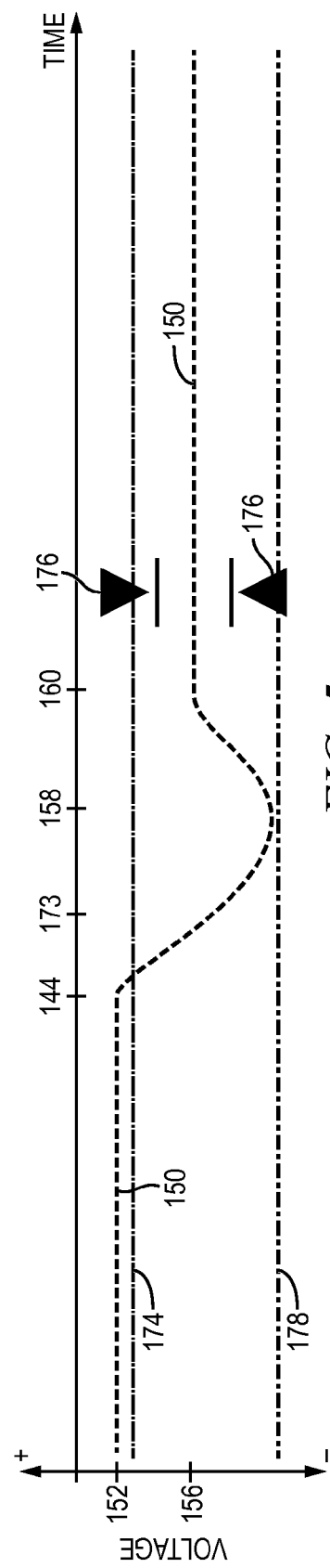

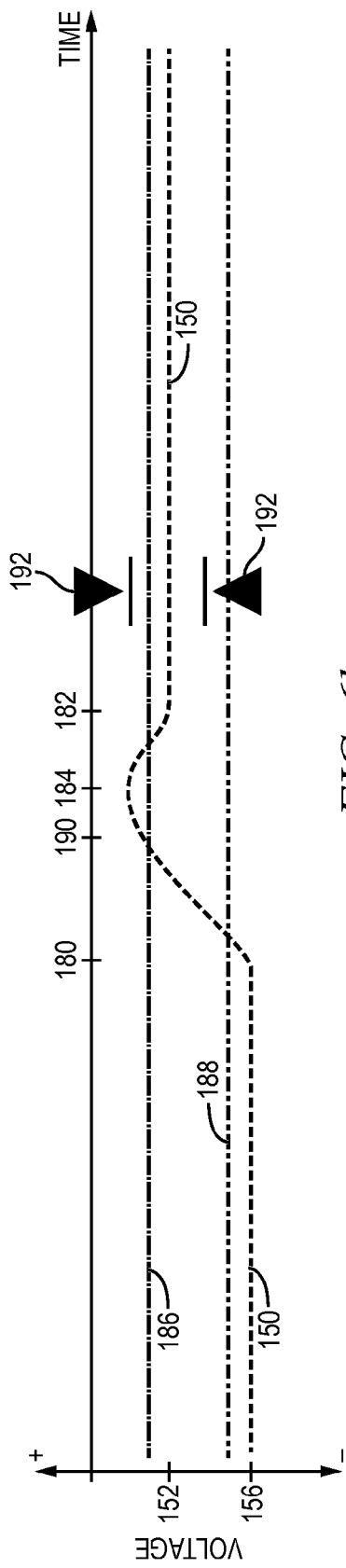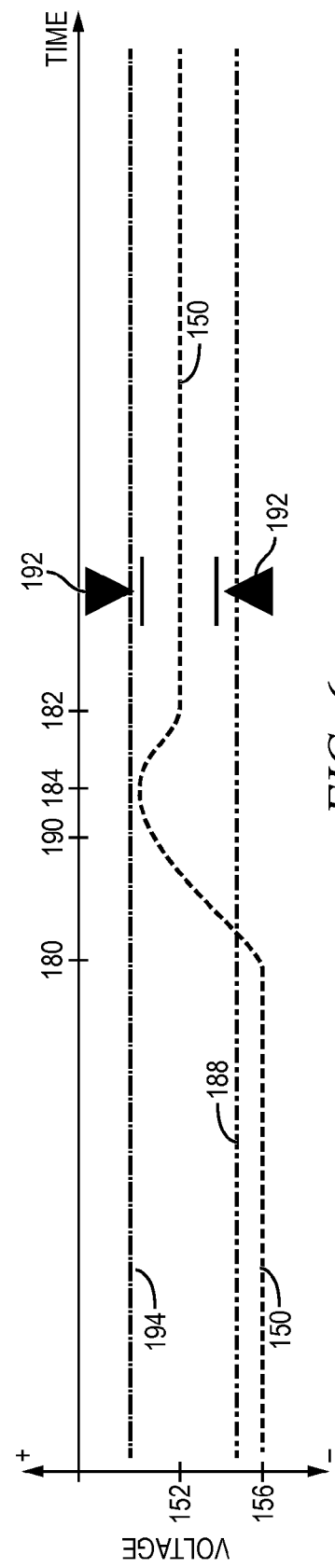

METHOD FOR STABILIZING THE GAIN OF A DISCRETE-STATE AUTOMATIC GAIN CONTROL CIRCUIT

FIELD OF THE INVENTION

The present invention relates in general to optical networks and, more particularly, to a method for stabilizing the gain of a discrete-state automatic gain control circuit.

BACKGROUND OF THE INVENTION

Broadband internet has become ubiquitous throughout most of the developed world. Countries and states are ranked based on the fastest internet access available to citizens. People everywhere clamor for the newest gigabit internet connections to become available to them. Faster internet speeds allow real-time video and audio communication across vast distances, streaming of live or pre-produced video and audio content, downloading and installation of applications quickly and easily over the internet, and transmitting of large amounts of data very quickly for many other useful endeavors.

Fiber optic technology is used extensively to transmit the signals for internet access between a service provider and the homes and offices of consumers. Passive optical networks (PONS) are used in many instances to deliver high speed internet and other data capabilities to end users. FIG. 1 illustrates a typical PON topology as PON 10. PON 10 includes an optical line terminal (OLT) 12 connected to an optical beam splitter 14 via fiber optic cable 16. Splitter 14 outputs an optical signal from OLT 12 to a plurality of optical network units (ONUs) 21-24 via fiber optic cables 26-29. Splitter 14 also combines optical signals from ONUs 21-24 into a single signal to OLT 12. While four ONUs 21-24 are illustrated, more or less ONUs are connected to an individual OLT in other embodiments. A single OLT will commonly have a 32-way splitter to connect to 32 different ONUs. A splitter can also be used to connect 64 or more ONUs to a single OLT.

The equipment for OLT 12 is generally located at a building of an internet service provider (ISP), and directly connected to the ISPs infrastructure through electrical signals. Splitter 14 is located on the premises of the ISP along with OLT 12, or is located remotely in an outside plant. The outside plant with splitter 14 is commonly located in a neighborhood, with each house in the neighborhood being an ONU. In other embodiments, splitter 14 is located in the demarcation room of an office building, where an ONU is dedicated to each company occupying a suite of the office building.

PON 10 utilizes wavelength division multiplexing (WDM) to transmit bidirectionally over a single optical cable. One wavelength of light is used to transmit from OLT 12 to ONUs 21-24, while a second wavelength of light is used to transmit from an ONU to the OLT. Commonly used wavelengths of light are 1,490 nanometer (nm) for downstream traffic and 1,310 nm for upstream traffic. Downstream traffic refers to transmission from OLT 12 to ONUs 21-24, and upstream traffic refers to transmission from an ONU to the OLT. Both wavelengths of light are transmitted along fiber-optic cables 16 and 26-29 without interfering with each other. A transmission from OLT 12 occurs at the same time, but at a different transmission frequency, as the OLT receives a transmission.

OLT 12 transmits to ONUs 21-24 in continuous mode (CM). OLT 12 is able to continuously send traffic on the designated frequency. ONUs 21-24 transmit in burst mode (BM). An ONU 21-24 sends a burst of data to OLT 12 after receiving a grant from the OLT. The burst of data is for a specified amount of time, and then the transmitting ONU must pause so that other ONUs are able to transmit another burst of data on the same frequency.

A transmission from OLT 12 is divided by splitter 14 and sent separately to each ONU 21-25. Every ONU connected to OLT 12 receives every packet of data transmitted by the OLT. Every downstream packet sent by OLT 12 is received by each ONU 21-24. Packets sent by OLT 12 are addressed to a specific ONU 21-24, so that the other ONUs ignore packets that are not addressed for them. Encryption is used in some embodiments to prevent an unaddressed ONU from reading data meant for another ONU. Some packets may be broadcast packets that are intended for and received by every ONU connected to OLT 12.

Conversely, splitter 14 combines the signals from each ONU 21-24 into a single optical signal to OLT 12. OLT 12 receives every upstream packet sent by all ONUs 21-24 on the single fiber optic cable 16. However, having multiple ONUs communicate on a single fiber to OLT 12 is problematic. When two different optical signals from two different ONUs are transmitted on a single cable at the same time, the signals interfere with each other. OLT 12 is unable to receive any of the signals when optical signals from multiple ONUs 21-24 overlap on fiber 16.

To solve the problem, OLT 12 is responsible for allocating upstream bandwidth to ONUs 21-24. OLT 12 sends a "grant" to an ONU which gives one of the ONUs 21-24 permission to use a defined interval of time for upstream transmission. The other ONUs, which did not receive a grant, are silent while the transmitting ONU sends a burst of data. After the transmitting ONU's allotted time interval is over, OLT 12 sends another grant to another ONU. OLT 12 continues to allocate upstream bandwidth by sending a grant to, and then receiving data from, each individual ONU 21-24.

Another issue arises in the reality that each ONU 21-24 is located in a random location remote from splitter 14. The optical signal from each individual ONU 21-24 travels a significantly different path along a respective fiber optic cable 26-29. The ONUs 21-24 are commonly different distances away from splitter 14. In one embodiment, splitter 14 is on the first floor of an office building, ONU 21 is also on the first floor, and ONU 22 is on the fifth floor and one hundred yards across the building. In another embodiment, ONU 23 is at a house nearby splitter 14, while ONU 24 is at a house a significant distance down the street. The variable distance of ONUs 21-24 from OLT 12 results in an optical signal at OLT 12 that is of an unpredictable magnitude and phase. Magnitude refers to the amplitude or power level of a signal.

The phases of burst mode packets received by OLT 12 are different from packet to packet, since ONUs 21-24 are not synchronized to transmit optical packets in phase, and the distance between the OLT and ONUs are random. The magnitude of each received packet is different due to the varying distance of each ONU 21-24 from OLT 12. The optical signal from an ONU attenuates more the farther the light wave has to travel to reach OLT 12 due to optical power loss in fiber optic cables 16 and 26-29. To synchronize the phases of received signals, OLT 12 uses burst mode clock and data recovery (BM-CDR) to generate a local clock with the same frequency and phase as the individual received optical packet. In addition, a burst mode amplifier, commonly a trans-impedance amplifier (TIA or TZ amplifier), is used by OLT 12 to normalize the magnitude of the received signal. Each burst received by OLT 12 begins with a predefined preamble that does not contain packet data. OLT 12 uses the preamble signal, usually about 40 nanoseconds (ns), to lock in the phase and magnitude of the received burst. The burst preamble lasts as little as 20 ns, and as long as 300 ns, in some embodiments. In other embodiments, a burst preamble lasts any amount of time required for the specific PON 10 implementation.

A burst mode amplifier uses an automatic gain control (AGC) circuit to detect the magnitude of an incoming signal and apply an amplification or attenuation as necessary for the signal to be within a useful working range for the circuitry of OLT 12. Analog AGC circuits are available that provide continuous control of the gain setting. For PON networks, the gain setting should be fixed for the entire data burst being received. However, an analog AGC circuit tends to wander, i.e., the gain setting floats up and down, during transmission. Changes in the gain setting during transmission can cause data errors.

Discrete-state AGC circuits are available that have digital control and hold the gain at one of a plurality of preset states. Each state represents a different gain value or level of an amplifier within the AGC. A discrete-state AGC has hysteresis built in to prevent the AGC from switching gain levels a second time immediately after a first gain state transition. The hysteresis of a discrete-state AGC means that the threshold level for increasing the gain level is lower than the threshold for returning back to the lower gain level. Therefore, once a gain level threshold is reached by the input signal, the power level of the input signal is not near another threshold. The hysteresis is helpful in reducing mid-burst level transitions. However, a discrete state AGC may still switch state mid-burst if the receiver input level for the data burst is sufficiently close to one of the internally generated gain state thresholds.

The input signal power level will drift slightly during transmission of a burst due to differing spectral content of the burst preamble versus the burst payload. That is, the specific data in the payload may result in a signal that has a slightly different power level relative to the preamble. In some embodiments, on-off keying is used. On-off keying modulates a carrier wave by turning the carrier wave signal on and off. The on-time and off-time of the carrier wave represent digital ones and zeros, respectively. A burst preamble may be a square wave, where the power of the signal is almost exactly halfway between zero and the full carrier wave power. On the other hand, the payload data may include more ones than zeros, or more zeros than ones, which results in an average power level that drifts closer to zero or closer to the full carrier wave power level. Amplitude shift keying, or other keying protocols, may be used, and similarly may result in a drifting average power level.

While the average power level drifts over the course of a data burst, the actual amplitude of an optical signal received by OLT 12 does not generally change significantly during a burst. Once the gain of an AGC circuit is set during a burst preamble, the electrical signal magnitude within OLT 12 will remain steady, even though the average power level floats up or down. If the power level drifts across a nearby threshold, an unnecessary and disruptive gain state change occurs. A gain level change in the payload of a data burst from an ONU 21-24 to OLT 12 will significantly change the magnitude of the electrical signal received by the circuitry of the OLT. The sudden change in electrical signal magnitude will commonly result in data traffic errors. Current technology is insufficient to adequately prevent AGC gain state transitions during reception of a data burst payload.

SUMMARY OF THE INVENTION

A need exists to reduce gain state transitions of a discrete AGC occurring during the payload of a data burst. Accordingly, in one embodiment, the present invention is an automatic gain controller (AGC) comprising an amplifier including a variable gain. A second order low-pass filter includes an input coupled to an output of the amplifier. A threshold detection circuit includes an input coupled to an output of the second order low-pass filter to compare an output signal of the second order low-pass to a threshold and an output of the threshold detection circuit coupled to control the variable gain of the amplifier.

In another embodiment, the present invention is an AGC comprising an amplifier including a variable gain. A resonant low-pass filter is coupled to an output of the amplifier. A threshold detection circuit includes an input coupled to an output of the resonant low-pass filter and an output coupled to control the variable gain of the amplifier.

In another embodiment, the present invention is an AGC comprising an amplifier including a variable gain. A resonant low-pass filter is coupled to control the variable gain of the amplifier.

In another embodiment, the present invention is a method of making an AGC comprising the steps of providing an amplifier including a variable gain, and configuring a resonant low-pass filter to control the variable gain of the amplifier.

BRIEF DESCRIPTION OF THE DRAWINGS

FIGS. 5a-5c illustrate timing of input and output signals of a low-pass filter relative to gain thresholds during a transition to a lower gain state; and FIGS. 6a-6c illustrate timing of input and output signals of a low-pass filter relative to gain thresholds during a transition to a higher gain state.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
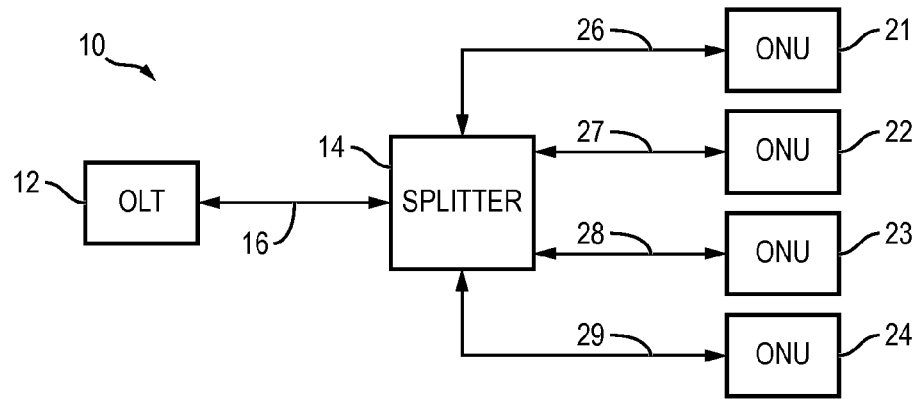
FIG. 1 illustrates a common passive optical network topology.
Figure 2:
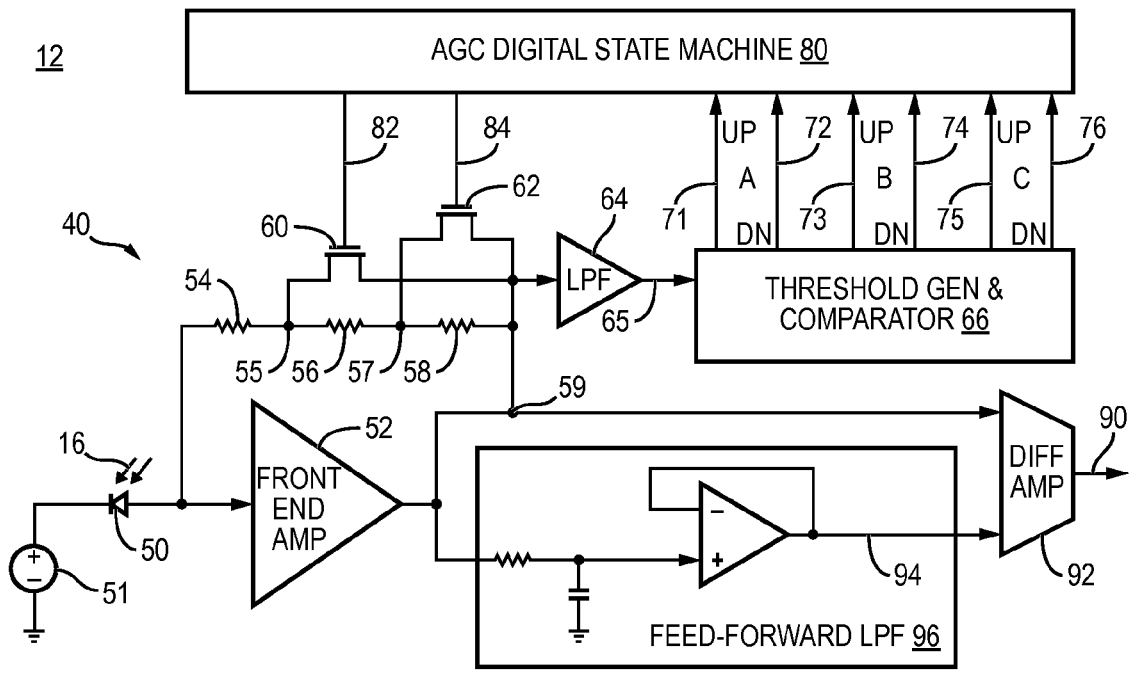
FIG. 2 illustrates a radio frequency receiver with discrete automatic gain control circuit.

FIG. 2 is a block diagram of a discrete AGC 40 used in a radio frequency (RF) receiver to compensate for the varying magnitude of a received optical signal. The input of AGC 40 varies in magnitude based on the distance of a transmitting ONU 21-24 from the receiving OLT 12. The output magnitude of AGC 40 is normalized to be within a range that is useful to subsequent RF electrical circuitry within OLT 12. Fiber optic cable 16 is connected to OLT 12, and the optical signal from ONUs 21-24 is routed to photodiode 50. Photodiode 50 converts the optical signal from one of the ONUs 21-24 into an electrical signal that can be processed using RF circuit components of AGC 40, and OLT 12 as a whole.

Photodiode 50 is coupled between voltage source 51 and front-end amplifier 52. When photons from fiber optic cable 16 hit photodiode 50, current flows through the photodiode between voltage source 51 and front-end amp 52. Front-end amplifier 52 includes an voltage amplifier, with gain determined by transimpedance resistors 54, 56, and 58. Transimpedance resistor 54 is coupled between photodiode 50 and circuit node 55. Transimpedance resistor 56 is coupled between circuit node 55 and circuit node 57. Transimpedance resistor 58 is coupled between circuit node 57 and circuit node 59, which is the output of front-end amplifier 52. Transimpedance resistor switches 60 and 62 determine which of resistors 54-58 are wired in series in the feedback loop of front-end amplifier 52. The total resistance in the feedback loop of resistors 54-58 determines the gain of front-end amplifier 52, which determines the gain of AGC 40.

The output of front-end amplifier 52 is coupled to a low-pass filter (LPF) 64. LPF 64 creates a signal approximately proportional to the output signal magnitude of front-end amplifier 52. The output of LPF 64 is connected to threshold generation and comparator block 66. Threshold generation and comparator block 66 detects the output level of LPF 64 to determine if the output signal from front-end amplifier 52 is outside of predetermined thresholds indicating the gain level needs to be changed. Threshold generation and comparator block 66 generates thresholds, then compares the signal from LPF 64 on circuit node 65 to those thresholds. Control signals 71-76 are output from threshold generation and comparator block 66, and are coupled to state machine 80. State machine 80 controls switches 60-62 using A-state control signal 82 and B-state control signal 84 based on control signals 71-76 from block 66.

In addition to LPF 64, the output of front-end amplifier 52 is also coupled to output 90 of AGC 40 through differential amplifier 92. Differential amplifier 92 is a limiting amplifier. The output of front-end amplifier 52 is a single ended signal, which is converted to a differential signal output 90 by differential amplifier 92. Providing the differential signal requires a slicing level 94 be generated by feed-forward LPF 96. Differential amplifier 92 outputs a differential signal proportional to the difference between the front-end amplifier 52 output and slicing level 94. The remaining circuitry of OLT 12 uses the differential signal in processing incoming data from ONUs 21-24.

Photodiode 50 is a semiconductor device that converts optical signals into electric current. The current is generated when photons are absorbed in the photodiode. A PIN diode structure is used for photodiode 50. In another embodiment, an avalanche photodiode is used for photodiode 50. A PIN diode has a wide undoped intrinsic semiconductor region between a p-type semiconductor region and an n-type semiconductor region. The wide intrinsic region improves the switching speed of photodiode 50. When a photon of sufficient energy strikes photodiode 50, an electron-hole pair is created in the photodiode. The holes are swept toward the anode of photodiode 50, and electrons toward the cathode, by voltage source 51 to produce an electric current. In one embodiment, indium gallium arsenide (InGaAs) is used as the semiconductor material for photodiode 50. Photodiode 50 is sensitive to light in the frequency range at which ONUs 21-24 send data to OLT 12. Photodiode 50 produces an electrical current that is approximately equivalent to the optical signal that OLT 12 receives from ONUs 21-24. The electrical current produced by photodiode 50 is coupled to an input of front-end amplifier 52.

Front-end amplifier 52 is a general RF front-end component. Front-end amplifier 52 receives the input signal from photodiode 50, applies a gain, and outputs the signal to differential amplifier 92. Differential amplifier 92 outputs a differential signal usable by the remaining circuitry of OLT 12. The output of front-end amplifier 52 is also provided to the input of the front-end amplifier through resistors 54-58 as feedback. Gain of front-end amplifier 52 is determined by the total resistance in the feedback path. The resistance is modified by A-state control signal 82 and B-state control signal 84 opening and closing switches 60-62 to selectively route electric current around resistors 56 and 58. In the disclosed embodiment, the gain of front-end amplifier 52 can be in three different states: A-state, B-state, and C-state. In other embodiments, more or less gain states are used.

The A gain state applies the lowest gain to the incoming signal from photodiode 50 because only resistor 54 is coupled as feedback between the output and input of front-end amplifier 52. A lower feedback resistance results in a lower gain setting of front-end amplifier 52. A-state is used for the strongest signals received from ONUs 21-24 because less gain is required to produce an output 90 in a usable range. The B-state provides a middle amount of gain because resistor 56 is coupled in series with resistor 54, but resistor 58 is still removed from the feedback loop by switch 62. The C gain state applies the most amount of gain because all three resistors 54-58 are coupled in series as the feedback loop for front-end amplifier 52. C-state is used for weaker signals received from an ONU 21-24, because a higher gain is required to generate an output signal 90 with a usable magnitude.

Switches 60 and 62 are n-channel metal-oxide-semiconductor field-effect transistors (MOSFETs). In other embodiments, p-channel MOSFETs or other electronic switches are used. A positive voltage, or digital one value, at A-state control signal 82 creates a conductive channel through switch 60, turning the switch on. When on, switch 60 creates an approximate electrical short circuit from circuit node 55 to circuit node 59. Only resistor 54 is in the feedback path of front-end amplifier 52 because switch 60 routes current around resistors 56 and 58. The gain of front-end amplifier 52 is reduced by the reduction in total feedback resistance.

A positive voltage, or digital one value, at B-state control signal 84 creates a conductive channel through switch 62, turning the switch on. When on, switch 62 creates an electrical short circuit from circuit node 57 to circuit node 59. Both resistor 54 and 56 are in the feedback path of front-end amplifier 52, but switch 62 routes current around resistor 58. The B-state provides a higher gain than the A-state by adding resistor 56 to the feedback loop in series with resistor 54. The B-state provides a lower gain than the C-state by removing resistor 58 from the feedback loop.

To put front-end amplifier 52 into C-state gain, both A-state control signal 82 and B-state control signal 84 are set to a logic zero. Both switches 60 and 62 are off, and feedback current flows through all three resistors 54, 56, and 58. Therefore, one resistor is in the feedback loop of front-end amplifier 52 in the A-state, two resistors are in the feedback loop in the B-state, and all three resistors are in the feedback loop in the C-state.

Threshold generation and comparator block 66 observes the output of LPF 64, which remains approximately proportional to the magnitude of the signal output by front-end amplifier 52 at circuit node 59. Block 66 increases the gain of front-end amplifier 52 if the magnitude of the signal at circuit node 59 is below a configured threshold. Once the gain is increased, the threshold for block 66 reducing gain again is significantly higher than the threshold that was crossed in increasing gain. Block 66 decreases the gain of front-end amplifier 52 if the magnitude of the signal at circuit node 59 is above a configured threshold. Once the gain is decreased, the threshold for block 66 increasing gain again is significantly lower than the threshold that was crossed in decreasing gain.

The change in threshold is what provides hysteresis for AGC 40. The hysteresis of AGC 40 means that as the signal magnitude at circuit node 59 floats around a threshold level, the gain state will not continuously change every time the threshold level is crossed. When a gain state threshold is crossed, the significantly different threshold for returning to the previous gain state means that the signal magnitude on circuit node 59 is unlikely to float far enough to trigger a return to the previous gain state. However, in prior art discrete-state AGC circuits without overshoot, a new data burst may have a magnitude that approaches close to a gain state threshold without actually crossing the gain state threshold. In the case where a received data burst is near the gain state threshold, the signal magnitude may float across the threshold mid-burst and cause a gain state change. The mid-burst gain state change causes data errors in OLT 12.

To reduce the likelihood of mid-burst gain state changes, LPF 64 with overshoot is used, as discussed in detail below with regard to the subsequent figures. As the magnitude of the input signal to LPF 64, at circuit node 59, changes, the output signal of LPF 64 does not merely follow the magnitude to remain constantly proportional. The output of LPF 64 overshoots the output value that is proportional to the input magnitude, and then settles to the value that is proportional. Therefore, if the signal magnitude of circuit node 59 is near a gain state threshold, the overshoot of LPF 64 causes the gain state change to occur rather than allowing the signal magnitude to float near a gain state threshold.

The overshoot triggers the gain state change in the preamble of a new burst of data so that the signal magnitude floating across that particular gain state threshold will not cause a gain state change during the payload of the data burst. Once the overshoot triggers a gain state change, threshold generation and comparator block 66 uses different gain state thresholds that are further away from the magnitude of the new data burst. The signal magnitude on circuit node 59 is unlikely to float far enough within a single burst to hit the new thresholds, even though the magnitude might float enough to hit the threshold of the previous gain state which is no longer used. Without overshoot, the signal at circuit node 59 is more likely to float and hit an active threshold. With overshoot, that threshold is triggered in the preamble instead of during the payload of a data burst. If the overshoot is insufficient to hit a gain state threshold, then the signal magnitude at circuit node 59 is far enough away from a threshold in the current gain state that the signal is unlikely to float across a threshold during a burst payload. The parameters of LPF 64 are selected such that the overshoot amount is greater than the amount of wander or drift expected from the signal at circuit node 59.

Figure 3:
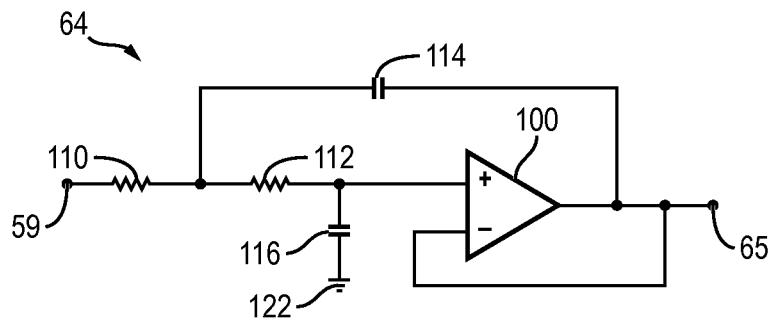
FIG. 3 illustrates a low-pass filter with possible overshoot.

To exhibit the overshoot feature of LPF 64, a second order or greater low-pass filter is used. When the quality, or 'Q', parameter of a second order or greater low-pass filter is set sufficiently high, the filter has a resonance effect which causes the output to overshoot magnitude changes at the input of the LPF. In the present embodiment, a Sallen-Key topology second order filter is used, as illustrated in FIG. 3 and described below. The disclosed Sallen-Key topology is simple to implement, gives a predictable amount of overshoot, and has low sensitivity to variations in manufacturing process parameters.

State machine 80 receives control signals 71-76 from threshold generation and comparator block 66, and opens or closes switches 60 and 62 accordingly by toggling A-state control signal 82 and B-state control signal 82. In the present embodiment, 6 control signals are used. Two control signals, an up and a down signal, exist for each available state A-C. When in the B-state, a pulse on B-up control signal 73 increases the gain-state to the C-state. A pulse on B-down control signal 74 decreases the gain-state from the B-state to the A-state. A pulse on A-up control signal 72 increases the gain-state from the A-state to the B-state, and a pulse on C-down control signal 75 decreases the gain-state from the C-state to the B-state. A-down control signal 71 and C-up control signal 76 are not used in this embodiment because A-state is the lowest gain state and C-state is the highest gain state. However, each gain state includes two control outputs so that a single circuit is copied within block 66 for each gain state. Adding additional gain states is easily accomplished in the design phase by copying the circuitry for each desired additional gain state.

In one embodiment, each control signal 71-76 is always active, and a pulse is transmitted on one of the signals each time the voltage level on circuit node 65 crosses a threshold regardless of current gain state and any hysteresis being applied. AGC digital state machine 80 is used to remember which state is currently active and ignores pulses on control signals 71-76 which are not for the present gain state. For example, threshold generation and comparator block 66 creates a pulse on B-down signal 74 each time a specific voltage threshold is crossed by the output of LPF 64 on circuit node 65, even if the current gain state is not B-state. However, state machine 80 ignores the pulse on B-down if B-state is not the presently active state. In other embodiments, threshold generation and comparator block 66 does not generate a pulse on a control signal 71-76 unless the appropriate state is presently active. The difference in the voltage level threshold for A-down and B-up, or between B-down and C-up, is what provides the hysteresis feature of AGC 40. The behavior of threshold generation and comparator block 66 is explained in more detail below with reference to FIG. 4. In other embodiments, other control signal schemes are used between block 66 and state machine 80.

Differential amplifier 92 generates differential output 90, which is the signal that is used by subsequent OLT 12 circuitry to process the received data, from the signal at circuit node 59. In order to create output 90 as a differential signal, feed-forward LPF 96 is used to create a slicing level 94. Slicing level 94 remains approximately halfway between the maximum and minimum value of the output of front-end amplifier 52. Differential amplifier 92 generates differential output 90 based on the difference in value between circuit node 59 and slicing level 94. Circuit node 59 includes an RF signal representative of the received optical signal from ONUs 21-24 with a gain applied, while slicing level 94 remains approximately at a central value of the signal at circuit node 59.

Differential output 90 remains at a magnitude usable by subsequent OLT 12 circuitry because the gain of front-end amplifier 52 changes as necessary to maintain the differential output at an acceptable power level. The hysteresis of threshold generation and comparator block 66, in combination with the overshoot of LPF 64, reduces the likelihood that a gain state change occurs outside of the preamble of a data burst. If a gain state change is likely to occur due to a drift in the average power of the signal input to front-end amplifier 52, the overshoot of LPF 64 triggers the gain state change in the preamble of the burst rather than waiting for drift to trigger the gain state change during the payload of the data burst. Data integrity is increased by reducing gain state changes in the middle of data bursts.

FIG. 3 illustrates one implementation of LPF 64 in detail, although other second or higher order low-pass filters are used in other embodiments. LPF 64 is a low-pass filter implemented with a Sallen-Key topology. LPF 64 includes op-amp 100, and a feedback network of resistor 110, resistor 112, capacitor 114, and capacitor 116. The negative input of op-amp 100 is directly short circuited to the output of op-amp 100 to provide feedback. Feedback is provided to the positive input of op-amp 100 through capacitor 114 and a voltage divider of resistors 110-112. Capacitor 116 is coupled between the positive input of op-amp 100 and ground node 122. The output of op-amp 100 is coupled to threshold generation and comparator block 66 via circuit node 65.

LPF 64 has an underdamped low pass response designed so that its step response produces an overshoot. Overshoot means the output of the LPF transitions beyond the value that the output of LPF 64 will ultimately settle to. Overshoot is the occurrence of a signal or function exceeding its target, or final steady state value. Overshoot arises commonly in the step response of bandlimited systems such as low-pass filters. For a step input, the percentage overshoot is the maximum value minus the step value divided by the step value. In electronics, overshoot refers to the transitory values of any parameter that exceeds a final steady state value during the transition from one value to another.

Any second or higher order low-pass filter that has complex roots, i.e., the roots include imaginary numbers and are not constrained to the real axis of the complex plane, can exhibit some degree of overshoot, and can be used in various embodiments. The amount of overshoot should be greater than the amount of wander or drift expected during a data burst, but less than the amount of hysteresis in threshold generation and comparator block 66. The overshoot will trigger a gain state change if the signal magnitude is within the expected drift of a state change, meaning there would be a significant likelihood of magnitude drift causing a gain state change mid-burst absent the overshoot of LPF 64. LPF 64 exhibits overshoot in the case where the power of a new data burst is higher than the previous data burst, and also overshoots in the case where the power of a new data burst is lower than the previous data burst. The overshoot of LPF 64 settles within the timing of the data burst preamble, so that the output of LPF 64 has reached a steady state prior to the payload portion of the data burst. In other embodiments, where the output of LPF 64 will not trigger a state change in settling back down to a final value, the timing of LPF 64 is such that the peak of the overshoot occurs during the preamble of the data burst, but the output of LPF 64 does not fully settle until after the preamble has completed.

The amount of overshoot in LPF 64 is important, and requires tight control to minimize variations over manufacturing process, supply voltage, and temperature. The Sallen-Key topology works well for LPF 64 because the topology is simple to implement, has a predictable overshoot percentage, and has low sensitivity to manufacturing process parameters. The low pass frequency of LPF 64 is generally on the order of tens of megahertz (MHz). Therefore, a filter design using operational amplifiers or unity gain amplifiers is best suited for LPF 64. In one embodiment, an overshoot of 30% of the amount of signal change is used for the overshoot. To achieve a 30% overshoot, a quality factor ("Q factor") equal to 1.5 is required. The Q factor of the illustrated Sallen-Key filter is equal to the square root of the ratio of the value of capacitor 114 to capacitor 116. Therefore, the illustrated Sallen-Key implementation will exhibit the 30% overshoot if the value of capacitor 114 divided by the value of capacitor 116 is equal to nine. In some embodiments, a Q factor of between 1.4 and 1.6 is used. In other embodiments, a Q factor of between 1.0 and 2.0 is used. In yet other embodiments, any Q factor resulting in the desired overshoot is used. Because the overshoot is controlled by capacitor value ratios, the overshoot percentage does not vary significantly as a function of absolute component values. Capacitor value ratios are highly controllable during manufacture, so the overshoot percentage is predictable and not significantly dependent on process variations.

Figure 4:
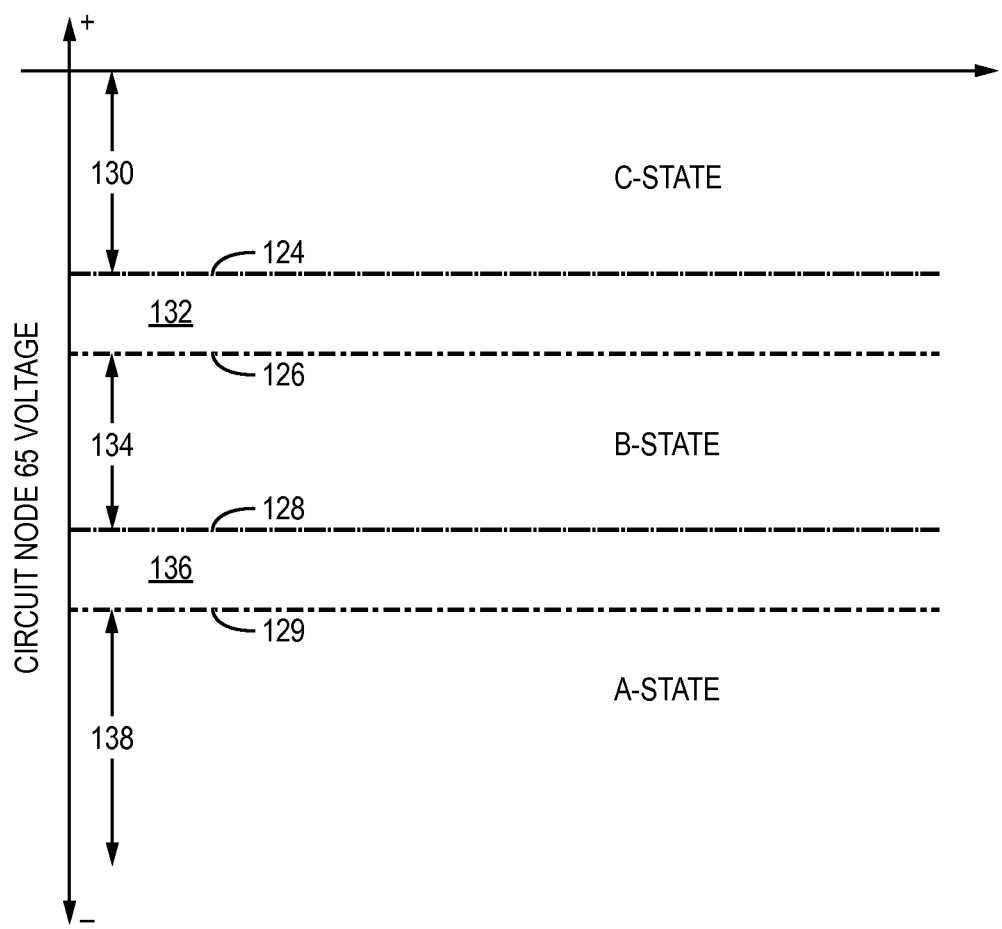
FIG. 4 illustrates the behavior of a threshold generation and comparator block.

FIG. 4 illustrates the behavior of threshold generation and comparator block 66, including how hysteresis is implemented within block 66. Block 66 generates thresholds 124, 126, 128, and 129 based on design parameters or configuration parameters updatable by reprogramming AGC 40. The vertical axis of FIG. 4 illustrates the voltage on circuit node 65, which is the output of LPF 64. A higher magnitude light signal received by photodiode 50 results in a greater negative voltage output from the photodiode. The higher magnitude light signal in turn results in a higher amplitude signal at circuit node 65 and a more negative voltage at circuit node 65 during the data burst.

C-state region 130 is the closest voltage region to zero input signal to photodiode 50 from fiber optic cable 16. With zero light from fiber optic cable 16 hitting photodiode 50, a voltage known as the "dark" voltage still exists at circuit nodes 59 and 65. Within C-state region 130, the magnitude of an incoming light signal on fiber optic cable 16 is the lowest, and a higher gain is required by front-end amplifier 52. B-state region 134 is reached when the voltage at circuit node 65 is more negative than C-state 130. When the voltage at circuit node 65 is more negative still, AGC 40 is in A-state 138, which requires the lowest amount of gain from front-end amp 52. A-state region 138, B-state region 134, and C-state region 130 correspond to states of state machine 80. When the voltage of circuit node 65 is in A-state region 138, state machine 80 is in the A-state. When the voltage of circuit node 65 is in B-state region 134, state machine 80 is in the B-state. When the voltage of circuit node 65 is in C-state region 130, state machine 80 is in the C-state.

Threshold 124 is the B-up threshold. If state machine 80 is currently in the B-state, the voltage of circuit node 65 must cross threshold 124 for state machine 80 to switch to the C-state and increase the gain setting. Threshold 126 is the C-down threshold. If state machine 80 is currently in the C-state, the voltage of circuit node 65 must cross threshold 126 to change to the B-state and decrease the gain setting. Hysteresis area 132 is between threshold 124 and threshold 126. The current state of state machine 80 is not known only based on the information that circuit node 65 is within hysteresis region 132, without also knowing which state the state machine was in prior to entering the hysteresis region. If state machine 80 was in the C-state, the state machine remains in the C-state when the voltage of circuit node 65 is within hysteresis region 132. If state machine 80 was in the B-state, the state machine remains in the B-state within hysteresis region 132. The distance between threshold 124 and threshold 126 defines the amount of hysteresis. When transitioning to C-state region 130, the voltage of circuit node 65 crosses threshold 124 in the positive direction. The voltage of circuit node 65 must then cross threshold 126 in the negative direction to return state machine 80 to the B-state. Therefore, a quick drift by circuit node 65 back and forth over threshold 124, which easily happens in many use cases, only results in a single state change of state machine 80.

Similarly, threshold 128 is the A-up threshold. If state machine 80 is currently in the A-state, the voltage of circuit node 65 must cross threshold 128 for state machine 80 to switch to the B-state and increase the gain setting. Threshold 129 is the B-down threshold. If state machine 80 is currently in the B-state, the voltage of circuit node 65 must cross threshold 129 to change to the A-state and decrease the gain setting. Hysteresis region 136 is between threshold 128 and 129. The current state of state machine 80 is not known only based on the information that circuit node 65 is within hysteresis region 136, without also knowing which state the state machine was in prior to entering the hysteresis region. If state machine 80 was in the B-state, the state machine remains in the B-state within hysteresis region 136. If state machine 80 was in the A-state, the state machine remains in the A-state within hysteresis region 136. The distance between threshold 128 and threshold 129 defines the amount of hysteresis. When transitioning to B-state region 134, the voltage of circuit node 65 crosses threshold 128 in the positive direction. The voltage of circuit node 65 must then cross threshold 129 in the negative direction to return state machine 80 to the A-state. Therefore, a quick drift by circuit node 65 back over threshold 128 in the negative direction, which easily happens in many use cases, does not immediately cause state machine 80 to revert to the A-state.

Control signals 71-76 are generated by comparators within block 66 that compare the voltage of circuit node 65 to a respective threshold level 124-129. Each of the used control signals 71-76 is associated with a threshold, and the control signals carry a binary one value if the voltage of circuit node 65 is more negative than the associated threshold. The unused threshold levels may actively indicate a comparison with the voltage at circuit node 65, but state machine 80 will ignore signals indicating a transition to an unused state. The control signals for every threshold level more negative than the voltage of circuit node 65 includes a binary zero value, and the control signals for threshold levels more positive than the voltage of circuit node 65 includes a binary one value. In some embodiments, more negative threshold control signals are a binary one value and more positive threshold control signals are a binary zero value. In other embodiments, control signals 71-76 pulse when a threshold is crossed rather than staying at a voltage level.

If the voltage of circuit node 65 is more negative than B-down threshold 129, then every control signal includes a binary one value. If the circuit node 65 voltage transitions into hysteresis region 136, B-down control signal 74 transitions to a binary zero value. The binary zero value of control signal 74 tells state machine 80 that circuit node 65 crossed threshold 129. State machine 80 does not react because in the A-state, crossing B-down threshold 129 has no effect.

As circuit node 65 becomes more positive, and crosses A-up threshold 128, A-up control signal 71 changes to a binary zero value. The binary zero value of A-up control signal 71 has an effect because state machine 80 is in the A-state. The hysteresis of AGC 40 is built into threshold generation and comparator block 66 based on the design of the threshold levels. However, block 66 merely compares the voltage of circuit node 65 against each threshold level without any need to understand the present state of AGC 40. State machine 80 is in charge of keeping track of the present state and switching states as the magnitude of received data bursts changes. State machine 80 has a default state for hysteresis regions 132 and 136, so that if AGC 40 boots up into one of the hysteresis regions the state machine can pick one of the two adjacent state regions.

Figure 5A:
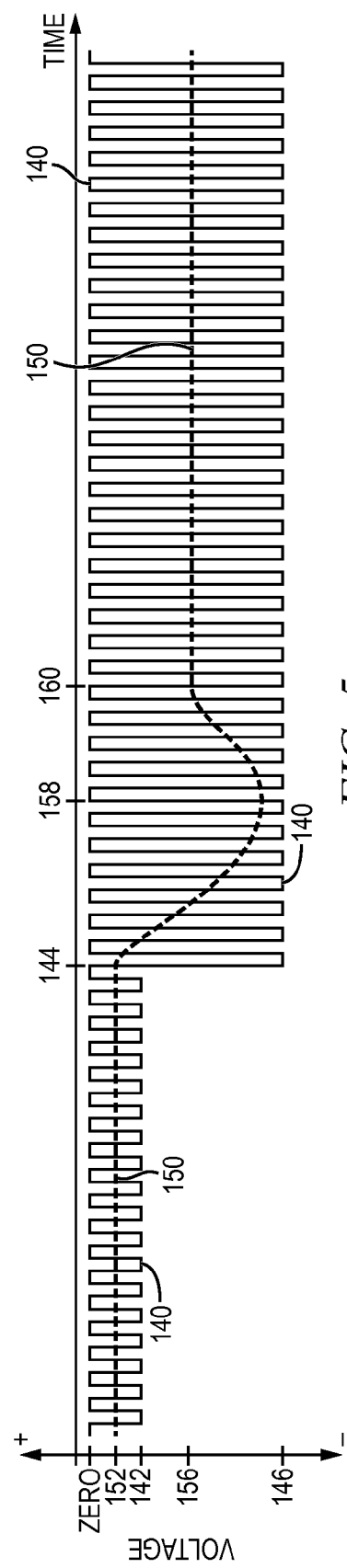

FIG. 5a illustrates an input magnitude change of LPF 64, and the concomitant overshoot in the LPF output signal. FIG. 5a includes time on the X, or horizontal, axis, and voltage on the Y, or vertical, axis. Input signal 140 is the voltage at circuit node 59. Input signal 140 is illustrated as a square wave, although in actual usage may include modulated or coded data from an ONU 21-24. Input signal 140 is originally received as a light signal by OLT 12, converted to an electrical signal by photodiode 50, has a gain applied by front-end amplifier 52, and finally is received as an electrical signal input to LPF 64 on circuit node 59.

Input signal 140 in FIG. 5a begins with a first magnitude 142. At time 144 the magnitude of the received signal 140 is increased significantly to a second magnitude 146. The magnitude of input signal 140 likely changes because a different ONU 21-24 is transmitting data after time 144 than is transmitting prior to time 144. The ONU 21-24 transmitting prior to time 144 is significantly farther away from OLT 12, which results in a more attenuated light signal received by photodiode 50. The ONU 21-24 transmitting a new data burst beginning at time 144 is closer to OLT 12. The signal 140 is less attenuated and at a higher magnitude after time 144 because the transmitting ONU is closer.

Output signal 150 is the voltage output from LPF 64 to threshold generation and comparator block 66 at circuit node 65. The output of a low-pass filter generally follows the central value of an input signal. Prior to time 144, signal 150 stays approximately at a first value 152, halfway between zero and magnitude 142. When the magnitude of input signal 140 changes at time 144, the value of output signal 150 moves to be approximately at value 156, halfway between zero and magnitude 146.

Without overshoot, output signal 150 would move from value 152 prior to time 144 directly to value 156 shortly after time 144. Output signal 150 would not include any value more positive than first value 152 or more negative than second value 156. Instead, when output signal 150 moves from first value 152 to second value 156, the value of the output signal 150 shoots past value 156 to experience a negative peak at time 158. Overshoot refers to output value 150 shooting past, or over, value 156 that the output signal will ultimately settle at. At time 158, the change in the value of output signal 150 reverses direction. Output signal 150 returns from a peak at time 158 to settle at value 156 by time 160.

The second data packet, having magnitude 146, begins with a preamble that lasts at least until the output signal 150 peak at time 158. If the magnitude change of input signal 140 were to trigger a gain state change, the state change would be triggered at or before the peak of output signal 150. Therefore, if the preamble lasts at least until time 158, the gain state is unlikely to change after the data burst preamble, when a state change would cause a data error to occur. In other embodiments, the preamble of the data burst with magnitude 146 lasts at least until time 160 when output signal 150 has settled at value 156.

After output signal 150 of LPF 64 settles at time 160, the output signal may drift up or down if the data content received from one of ONUs 21-24 causes input signal 140 to be low or high a greater percentage of the time. However, signal 150 would have to drift at least to a more negative level than the value of the peak that occurred at time 158 to trigger a gain state change. Normal power fluctuations of input signal 140 are unlikely to be large enough to move signal 150 from value 156 to a value more negative than the peak that occurred at time 158.

FIG. 5b illustrates output signal 150 from LPF 64 relative to thresholds applied by threshold generation and comparator block 66 when a peak of signal 150 triggers a gain state change. Output signal 150 is coupled from an output of LPF 64 to an input of block 66. Input signal 140 and output signal 150 are the same signals in FIG. 5b as in FIG. 5a, although the input signal is not illustrated to improve clarity.

Line 172 illustrates the threshold value at which block 66 will reduce the gain state of AGC 40 from C-state to B-state. If the power level of an incoming data burst results in an output signal 90 that is at a higher magnitude than the subsequent circuitry of OLT 12 can handle, the gain level is reduced to keep the output signal 90 within an acceptable range. After a higher power data burst begins at time 144, output signal 150 begins moving from value 152 to value 156. Value 156 is the value that is halfway between the minimum and maximum values of input signal 140 during the second data burst. As illustrated, value 156 is halfway between zero and magnitude 146. As explained above, output signal 150 does not initially settle at value 156, but overshoots value 156 to create a peak at time 158.

The value of signal 150 crosses over threshold 172 at time 173, triggering state machine 80 to reduce the gain state of AGC 40 by one level, from C-state to B-state. After time 173, AGC 40 no longer uses value 172 as a threshold. When signal 150 crosses value 172 again to settle at value 156, no gain state change occurs even though value 172 is crossed. Instead, AGC 40 uses value 174 as the threshold that signal 150 must reach for the gain state to return to the C-state. The difference in value between threshold 172 and 174 provides the hysteresis of AGC 40. The distance between threshold 172 and threshold 174 is the amount of hysteresis.

Signal 150 continues changing in the negative direction until a peak is reached at time 158. The change of signal 150 reverses direction at time 158, and signal 150 settles to value 156 at time 160. During the transmission of a data burst, the value of signal 150 may drift up or down from value 156. Arrows 176 show the maximum amount by which signal 150 is expected to drift during a data burst under normal circumstances. Threshold 172 is within arrows 176. There is a significant possibility that signal 150 will drift across threshold 172 during the data burst payload occurring after time 160. However, because the overshoot occurring between times 144 and 160 crossed threshold 172 and triggered the gain state change during the preamble of the data burst, no state change occurs after time 160 even if signal 150 drifts across threshold 172. Threshold 172 is not active during the data burst payload.

Instead, the value of signal 150 must cross threshold 174 to cause a gain state change. Threshold 174 is outside of arrows 176, so there is not a significant likelihood that a gain state change will occur during the data burst payload occurring immediately after time 160. No state change occurs shortly after time 144 when signal 150 crosses threshold 174 because threshold 174 is not active until time 173 when signal 150 crosses threshold 172 and moves from C-state to B-state. Threshold 174 controls movement from B-state back to C-state, and is not active prior to time 173 when AGC 40 remains in the C-state.

In FIG. 5c, threshold 178 is used as the threshold for transitioning from C-state to B-state. AGC 40 begins in the C-state, as with FIG. 5b, but signal 150 never reaches the value of threshold 178 even given the overshoot between times 144 and 160. The peak of signal 150 at time 158 is still more positive than the value of threshold 178. AGC 40 remains in the C-state after time 160 because the overshoot that LPF provides signal 150 never crosses threshold 178. Because the peak of signal 150 at time 158 is outside of arrows 176 and did not trigger threshold 178, the threshold is also outside of arrows 176.

Signal 150 is unlikely to drift outside of arrows 176 in the middle of a data burst payload. Therefore, signal 150 is unlikely to cross threshold 178 and trigger a gain state change in AGC 40 mid-packet. The overshoot of signal 150 did not trigger a gain state change, but signal 150 did not settle close enough to threshold 178 to require a gain state change to remain safe from power level drift causing a mid-burst gain state change. A mid-burst gain state change is unlikely because signal 150 settles at value 156, and is unlikely to drift far enough to cross threshold 178.

Threshold 174 is the value of signal 150 that will cause AGC 40 to change from B-state to C-state, but is not active at any time in FIG. 5c. AGC 40 remains in C-state for the entire duration of FIG. 5c because threshold 178 is never crossed to cause a state change from C-state to B-state. AGC 40 is unlikely to experience a state change for the duration of the data burst beginning at time 144 because no gain state threshold is within arrows 176, which illustrate the maximum range of likely drift for signal 150.

Figure 6A:
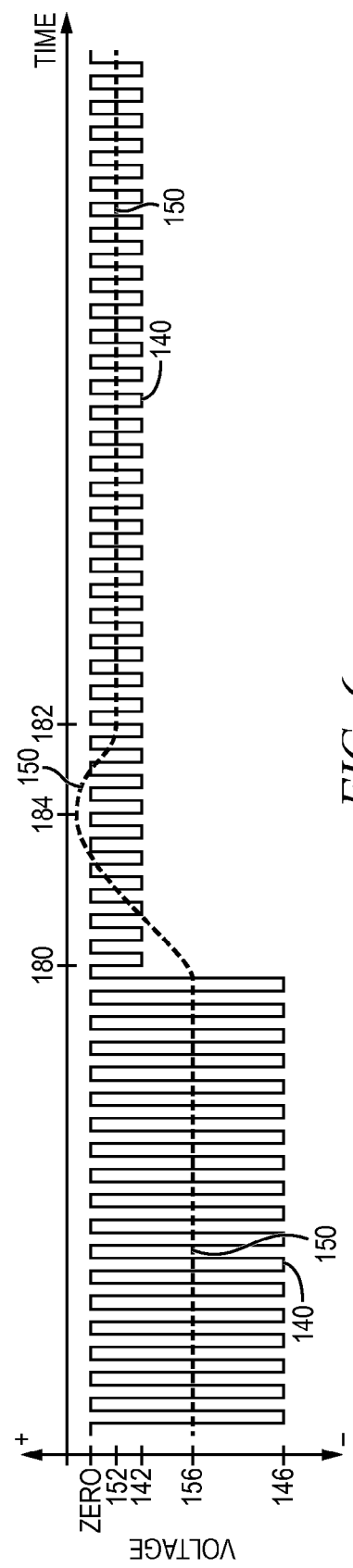

FIG. 6a illustrates input signal 140 and output signal 150 during a transition to a signal having lower power. FIG. 6a includes time on the X, or horizontal, axis, and voltage on the Y, or vertical, axis. At the beginning of the graph in FIG. 6a, a data burst is being received that results in signal 140 having a magnitude 146. At time 180, a new data burst begins at a power level that results in signal 140 having a magnitude 142. After time 180, output signal 150 of LPF 64 transitions from level 156 to level 152. Level 156 is halfway between zero and magnitude 146, while level 152 is halfway between zero and magnitude 142. Low-pass filters generally have an output that stays around the average value of the input signal. However, a second or greater order low-pass filter exhibits resonance which results in the output signal overshooting the ultimate target value, as seen between times 180 and 182 in FIG. 6a.

Without overshoot, output signal 150 would move from value 156 prior to time 180 directly to value 152 some time after time 180. Output signal 150 would not include any value more positive than value 152 or more negative than value 156. Because of overshoot exhibited by LPF 64, when output signal 150 moves from value 156 to value 152, the value of output signal 150 shoots past value 152 to experience a peak at time 184. Overshoot refers to output value 150 shooting past, or over, value 152 that the output signal will ultimately settle at. At time 184, the change in the value of output signal 150 reverses direction. Output signal 150 returns from a peak at time 184 to settle at value 152 by time 182.

The second data burst, having magnitude 142, begins with a preamble that lasts at least until the output signal 150 peak at time 184. If the magnitude change of input signal 140 were to trigger a gain state change, the state change would be triggered at or before the peak of output signal 150. Therefore, if the preamble lasts at least until time 184, the gain state is unlikely to change after the data burst preamble, when a state change would cause a data error to occur. In other embodiments, the preamble of the data burst with magnitude 142 lasts at least until time 182 when output signal 150 has settled at value 152.

After output signal 150 of LPF 64 settles at time 182, the output signal may drift up or down if the power of input signal 140 changes. However, signal 150 would have to drift at least to a value more positive than the value of the peak that occurred at time 184 to trigger a gain state change. Normal power fluctuations of incoming signals are unlikely to be large enough to move signal 150 from value 152 to a value more positive than the peak that occurred at time 184. If a threshold were more negative than the peak that occurred at time 184, then the overshoot would have triggered the gain state change already prior to the peak at time 184.

FIG. 6b illustrates output signal 150 from LPF 64 relative to thresholds applied by threshold generation and comparator block 66 when a peak of signal 150 triggers a gain state change increasing gain. Output signal 150 is coupled from an output of LPF 64 to an input of block 66 at circuit node 65. Input signal 140 and output signal 150 are the same signals in FIGS. 6b and 6c as in FIG. 6a, although the input signal is not illustrated to improve clarity.

Line 186 illustrates the threshold value at which block 66 will increase the gain state of AGC 40 from B-state to C-state. If the power level of an incoming data burst results in an output signal 90 that is at a lower magnitude than the subsequent circuitry of OLT 12 can handle, the gain level is increased to keep the output signal 90 within an acceptable range. After a lower power data burst begins at time 180, output signal 150 begins moving from value 156 to value 152. Value 152 is the value that is halfway between the minimum and maximum values of signal 140 during the second data burst. As illustrated, value 152 is halfway between zero and magnitude 142. As explained above, output signal 150 does not initially settle at value 152, but overshoots value 152 to create a peak at time 184.

The value of signal 150 crosses over threshold 186 at time 190, triggering state machine 80 to increase the gain state of AGC 40 from B-state to C-state. After time 190, AGC 40 no longer uses value 186 as a threshold. When signal 150 crosses value 186 to settle at value 152, no gain state change occurs even though value 186 is crossed. Instead, AGC 40 uses value 188 as the threshold that signal 150 must reach for the gain state to return to the B-state. The difference in value between threshold 186 and 188 provides the hysteresis of AGC 40. The distance between threshold 186 and threshold 188 is the amount of hysteresis. In some embodiments, the amount of hysteresis is the same for a transition in the positive direction, as in FIGS. 6a-6c, and in the negative direction, as in FIGS. 5a-5c. In other embodiments, the amount of hysteresis is different depending on either the initial gain state, the direction of the transition, or both.

Signal 150 continues changing in the positive direction until a peak is reached at time 184. The change of signal 150 reverses toward the negative direction at time 184, and signal 150 settles to value 152 at time 182. During the transmission of a data burst, the value of signal 150 may drift up or down from value 152. Arrows 192 show the maximum amount by which signal 150 is expected to drift during a data burst payload under normal circumstances. Threshold 186 is within arrows 192. There is a significant possibility that signal 150 will drift across threshold 186 during the data payload transfer occurring after time 182. However, overshoot between times 180 and 182 caused signal 150 to cross threshold 186, triggering the gain state change during the preamble of the data burst. No state change occurs after time 182 even if signal 150 drifts across threshold 186. Threshold 186 is not active during the data burst after time 190 when the gain state change is triggered by overshoot of LPF 64. Without overshoot of LPF 64, signal 150 could drift across threshold 186 and trigger a gain state change mid-payload.

Instead, the value of signal 150 must drift across threshold 188 to cause a gain state change. Threshold 188 is outside of arrows 192, so there is not a significant likelihood that a gain state change will occur during the data payload transmission occurring immediately after time 182. No state change occurs shortly after time 180 when signal 150 crosses threshold 188 because threshold 188 is not active until time 190 when signal 150 crosses threshold 186 and moves AGC 40 from B-state to C-state. Threshold 188 controls movement from C-state back to B-state, and is not active prior to time 190 when AGC 40 is in the B-state.

In FIG. 6c, threshold 194 is used as the threshold for transitioning from B-state to C-state. AGC 40 begins in the B-state, as with FIG. 6b, but signal 150 never reaches the value of threshold 194 even given the overshoot between times 180 and 182. The peak of signal 150 at time 184 is still more negative than the value of threshold 194. AGC 40 remains in the B-state after time 182 because the overshoot that LPF 64 provides signal 150 never crosses threshold 194. Because the peak of signal 150 at time 184 is outside of arrows 192 and did not trigger threshold 194, the threshold is also outside of arrows 192.

Signal 150 is unlikely to drift outside of arrows 192 in the middle of a data burst. Therefore, signal 150 is unlikely to cross threshold 194 and trigger a gain state change in AGC 40 mid-payload. The overshoot of signal 150 did not trigger a gain state change, but signal 150 did not settle close enough to threshold 194 to require a gain state change to remain safe from power level drift causing a mid-burst gain state change. A mid-burst gain state change is unlikely because signal 150 settles at value 152, and is unlikely to drift far enough to cross threshold 194.

Threshold 188 is the value of signal 150 that will cause AGC 40 to change from C-state to B-state, but is not active at any time in FIG. 6c. AGC 40 remains in B-state for the entire duration of FIG. 6c because threshold 194 is never crossed to cause a state change from B-state to C-state. AGC 40 is unlikely to experience a state change for the duration of the data payload transfer beginning after time 182 because no gain state threshold is within arrows 192, which illustrate the maximum range of likely drift for signal 150.

Controlling an AGC with the output of a LPF having overshoot forces any gain state change that would happen in the data portion of a data burst to instead occur during the preamble. OLT 12 with AGC 40 having the overshoot feature reduces the number of data errors that occur. Output signal 150 of LPF 64 is not allowed to settle close enough to a gain state change threshold that drift of signal 150 is likely to cross a gain state threshold. A gain state change during transmission of a data burst payload is often enough to generate an error in the data contained within the payload. The overshoot of LPF 64 stabilizes AGC 40 during the preamble, prior to the start of the burst payload, to reduce errors due to mid-payload gain state changes.

While one or more embodiments of the present invention have been illustrated in detail, the skilled artisan will appreciate that modifications and adaptations to those embodiments may be made without departing from the scope of the present invention as set forth in the following claims.

What is claimed:

1. An automatic gain controller (AGC), comprising:
   an amplifier including a variable gain;
   a second order low-pass filter including an input coupled to an output of the amplifier;
   a threshold detection circuit including an input coupled to an output of the second order low-pass filter to compare an output signal of the second order low-pass filter to a threshold and an output of the threshold detection circuit coupled to control the variable gain of the amplifier; and
   a state machine coupled between the output of the threshold detection circuit and the amplifier, wherein the state machine is configured to transition based on a current state of the state machine.

2. The AGC of claim 1, wherein the second order low-pass filter further includes a Sallen-Key topology.

3. The AGC of claim 2, wherein the Sallen-Key topology comprises a quality factor between 1.4 and 1.6.

4. The AGC of claim 1, further including a photodiode coupled to an input of the amplifier.

5. An automatic gain controller (AGC), comprising:
   an amplifier including a variable gain;
   a resonant low-pass filter coupled to an output of the amplifier;
   a resistor coupled between the output of the amplifier and an input of the amplifier; and
   a threshold detection circuit including an input coupled to an output of the resonant low-pass filter and a binary output coupled to control the variable gain of the amplifier.

6. The AGC of claim 5, wherein the resonant low-pass filter includes a Sallen-Key topology.

7. The AGC of claim 6, wherein the Sallen-Key topology includes a quality factor between 1.4 and 1.6.

8. The AGC of claim 5, further including a photodiode coupled to an input of the amplifier.

9. The AGC of claim 5, further including a differential amplifier coupled to the output of the amplifier.

10. The AGC of claim 5, further including a state machine coupled between the threshold detection circuit and amplifier.

11. An automatic gain controller (AGC), comprising:
    an amplifier;
    a resonant low-pass filter coupled to the amplifier, wherein the resonant low-pass filter includes a Sallen-Key topology; and
    a threshold comparator coupled to an output of the low-pass filter and configured to control a gain of the amplifier, wherein the threshold comparator includes hysteresis.

12. The AGC of claim 11, wherein the Sallen-Key topology includes a quality factor between 1.4 and 1.6.

13. The AGC of claim 11, further including a state machine coupled between the threshold comparator and resonant low-pass filter.

14. The AGC of claim 11, further including a photodiode coupled to an input of the amplifier.

15. The AGC of claim 11, further including a differential amplifier coupled to an output of the amplifier.

16. A method of making an automatic gain controller (AGC), comprising:
    providing an amplifier;
    coupling a resonant low-pass filter to an output of the amplifier; and
    providing a threshold detection circuit coupled to an output of the resonant low-pass filter and configured to control a gain of the amplifier, wherein the threshold detection circuit includes hysteresis and the resonant low-pass filter is configured to exhibit overshoot to trigger the hysteresis of the threshold detection circuit.

17. The method of claim 16, further including providing the resonant low-pass filter comprising a Sallen-Key topology.

18. The method of claim 17, further including providing the Sallen-Key topology comprising a quality factor between 1.4 and 1.6.

19. The method of claim 16, further including a resistor coupled between an input of the amplifier and an output of the amplifier.

20. The method of claim 16, further including a state machine coupled between the threshold detection circuit and amplifier.

21. The AGC of claim 1, wherein the variable gain of the amplifier includes a plurality of discrete gain levels.

22. The AGC of claim 5, wherein the variable gain of the amplifier includes a plurality of discrete gain levels.

* * * * *